US009530889B2

(12) United States Patent
Chen

(10) Patent No.: US 9,530,889 B2
(45) Date of Patent: Dec. 27, 2016

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Chao-Hsuing Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/719,286

(22) Filed: May 21, 2015

(65) Prior Publication Data

US 2016/0343845 A1 Nov. 24, 2016

(51) Int. Cl.
| | | |
|---|---|---|
| H01L 27/12 | (2006.01) | |
| H01L 29/78 | (2006.01) | |
| H01L 29/66 | (2006.01) | |
| H01L 29/06 | (2006.01) | |
| H01L 21/762 | (2006.01) | |
| H01L 21/306 | (2006.01) | |
| H01L 21/02 | (2006.01) | |
| H01L 21/265 | (2006.01) | |
| H01L 29/167 | (2006.01) | |

(52) U.S. Cl.
CPC ....... *H01L 29/785* (2013.01); *H01L 21/02126* (2013.01); *H01L 21/26513* (2013.01); *H01L 21/30604* (2013.01); *H01L 21/76264* (2013.01); *H01L 29/0649* (2013.01); *H01L 29/167* (2013.01); *H01L 29/66795* (2013.01)

(58) Field of Classification Search
CPC ............. H01L 29/785; H01L 21/02126; H01L 21/26513; H01L 21/30604; H01L 21/76264; H01L 29/0649; H01L 29/167; H01L 29/66795
USPC ........................................................ 257/347
See application file for complete search history.

(56) References Cited

U.S. PATENT DOCUMENTS

| | | | |
|---|---|---|---|
| 7,667,271 B2 | 2/2010 | Yu et al. | |
| 8,237,226 B2 * | 8/2012 | Okano ................. | H01L 21/324 257/368 |
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,598,003 B2 * | 12/2013 | Murtthy ................ | 257/E21.431 |

(Continued)

*Primary Examiner* — Tod T Van Roy
*Assistant Examiner* — Vu A Vu
(74) *Attorney, Agent, or Firm* — McDermott Will & Emery LLP

(57) ABSTRACT

A fin structure including a well layer, an oxide layer over the well layer and a channel layer over the oxide layer is formed. An isolation insulating layer is formed so that the channel layer protrudes from the isolation insulating layer and at least a part of the oxide layer is embedded in the isolation insulating layer. A gate structure is formed over a part of the fin structure and over the isolation insulating layer. A recessed portion is formed by etching a part of the fin structure such that a surface of the well layer is exposed. An epitaxial layer is formed over the exposed well layer and over the channel layer. The epitaxial layer formed over the exposed well layer is modified such that etching selectivity of the modified layer against an alkaline solution with respect to a non-modified epitaxial layer is increased.

20 Claims, 10 Drawing Sheets

(56) References Cited

U.S. PATENT DOCUMENTS

| | | |
|---|---|---|
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,853,060 B1 * | 10/2014 | Lai .................... H01L 21/02532 438/478 |
| 2011/0068407 A1 | 3/2011 | Yeh et al. |
| 2013/0011983 A1 | 1/2013 | Tsai et al. |
| 2014/0191321 A1 * | 7/2014 | Cheng ............... H01L 21/76283 257/347 |
| 2014/0252412 A1 | 9/2014 | Tsai et al. |

* cited by examiner

SEMICONDUCTOR DEVICE AND MANUFACTURING METHOD THEREOF

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility. Further, channel on oxide structures have been proposed to improve carrier mobility and to maintain a straight fin profile.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-19 show exemplary processes for manufacturing a semiconductor FET device having a fin structure (Fin FET). It is understood that additional operations can be provided before, during, and after operations shown by FIGS. 1-18, and some of the operations described below can be replaced or eliminated, for additional embodiments of the method. The order of the operations may be interchangeable.

Figure 1:
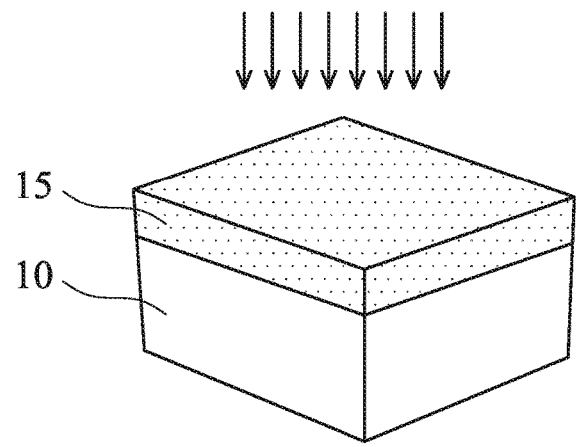
FIGS. 1-19 are exemplary processes for manufacturing a semiconductor FET device having a fin structure (Fin FET) according to one embodiment of the present disclosure.

In FIG. 1, impurity ions (dopants) are implanted into a silicon substrate 10 to form a well region 15. The ion implantation is performed to prevent a punch-through effect.

The substrate 10 is, for example, a p-type silicon substrate with an impurity concentration in a range of about $1.12 \times 10^{15}$ cm$^3$ and about $1.68 \times 10^{15}$ cm$^3$. In other embodiments, The substrate 10 is an n-type silicon substrate with an impurity concentration in a range of about $0.905 \times 10^{15}$ cm$^{-3}$ and about $2.34 \times 10^{15}$ cm$^{-3}$. The Si substrate 10 has a (100) upper surface in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The dopants are, for example boron (BF$_2$) for an n-type Fin FET and phosphorus for a p-type Fin FET.

Figure 2:
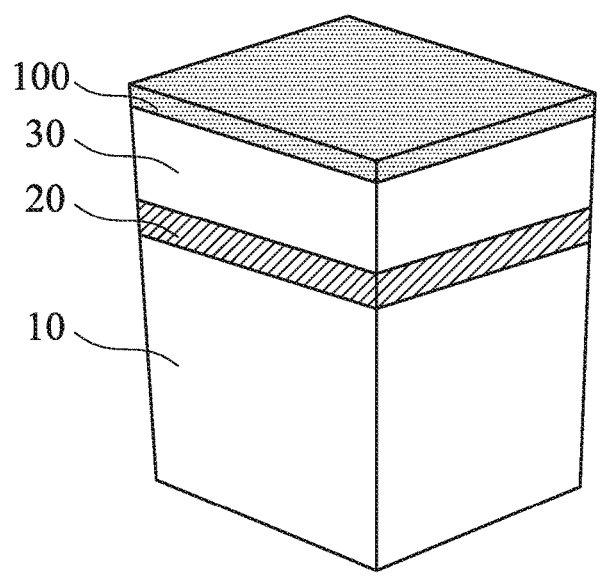

As shown in FIG. 2, a first epitaxial layer 20 is epitaxially grown over the surface of the substrate 10, and a second epitaxial layer 30 is epitaxially grown over the first epitaxial layer. Further, a mask layer 100 is formed over the second epitaxial layer 30.

The first epitaxial layer 20 may be, for example Ge or Si$_{(1-x)}$Ge$_x$, where x is in a range of about 0.1 to about 0.9. In this embodiment, Si$_{(1-x)}$Ge$_x$ is used as the first epitaxial layer. In the present disclosure, Si$_{1-x}$Ge$_x$ may be simply referred to as SiGe. The thickness of the SiGe first epitaxial layer 20 is in a range of about 10 nm to about 100 nm in some embodiments. In certain embodiments, the thickness of the SiGe first epitaxial layer 20 is in a range of about 1 nm to about 20 nm, or in a range of about 2 nm to 10 nm in other embodiments.

The second epitaxial layer 30 may be, for example Si or Si$_{(1-y)}$Ge$_y$, where y<x. The second epitaxial layer is Si in this embodiment. The Si second epitaxial layer 30 has a thickness in a range of about 20 nm to about 70 nm in some embodiments. In certain embodiments, the thickness of the Si second epitaxial layer 30 is in a range of about 30 nm to about 50 nm.

The mask layer 100 may include, for example, a pad oxide (e.g., silicon oxide) layer and a silicon nitride (SiN) mask layer in some embodiments. The thickness of the pad oxide layer is in a range of about 2 nm to about 15 nm and the thickness of the silicon nitride mask layer is in a range of about 10 nm to about 50 nm in some embodiments. The mask layer is SiN in this embodiment.

By using patterning operations, the mask layer 100 is patterned into mask patterns 105. The width of each of the patterns 105 is in a range of about 5 nm to about 40 nm in some embodiments, or may be in a range of about 10 nm to about 30 nm in other embodiments.

Figure 3:
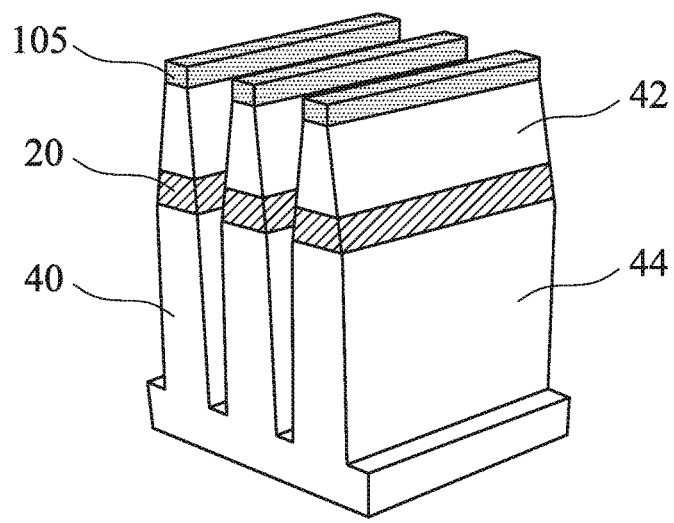

As shown in FIG. 3, by using the mask patterns 105 as etching masks, the Si second epitaxial layer 30, the SiGe first epitaxial layer 20 and the Si substrate 10 are pattered into fin structures 40 by trench etching using a dry etching method and/or a wet etching method.

As shown in FIG. 3, three fin structures 40 are disposed adjacent to each other. However, the number of the fin structures is not limited to three. The numbers may be one, two, four or five or more. In addition, one or more dummy fin structures may be disposed adjacent to both sides of the fin structures 40 to improve pattern fidelity in patterning processes. The width of the fin structure 40 is in a range of about 5 nm to about 40 nm in some embodiments, and may be in a range of about 7 nm to about 15 nm in certain embodiments. The height of the fin structure 40 is in a range of about 100 nm to about 300 nm in some embodiments, and may be in a range of about 50 nm to 100 nm in other embodiments. The space between the fin structures 40 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits.

Figure 4:
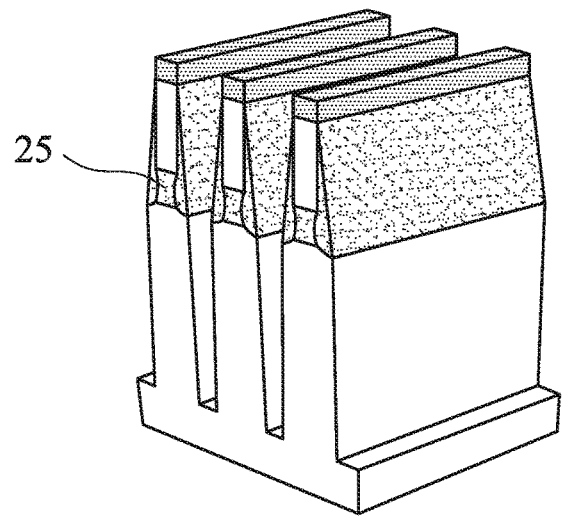

As shown in FIG. 4, the SiGe first epitaxial layers 20 in the fin structures 40 are oxidized to form SiGe oxide layers 25. Since SiGe (in particular Ge) is oxidized faster than Si, the SiGe oxide layers 25 can be selectively formed. However, side walls of the Si first epitaxial layer 30 and the Si substrate 10 may also be slightly oxidized to form silicon oxide. The SiGe layer can be oxidized by an annealing or heating in an atmosphere containing oxygen ($O_2$), $O_2$ and hydrogen ($H_2$) or steam ($H_2O$). In this embodiment, wet oxidation using steam is performed at a temperature range of about 400° C. to about 600° C., at about atmospheric pressure. The thickness of the SiGe oxide layer is in a range of about 5 nm to 25 nm in some embodiments, or about 10 nm to 20 nm in other embodiments. If the first epitaxial layer 20 is Ge, the oxide layer 25 is germanium oxide.

Figure 5:
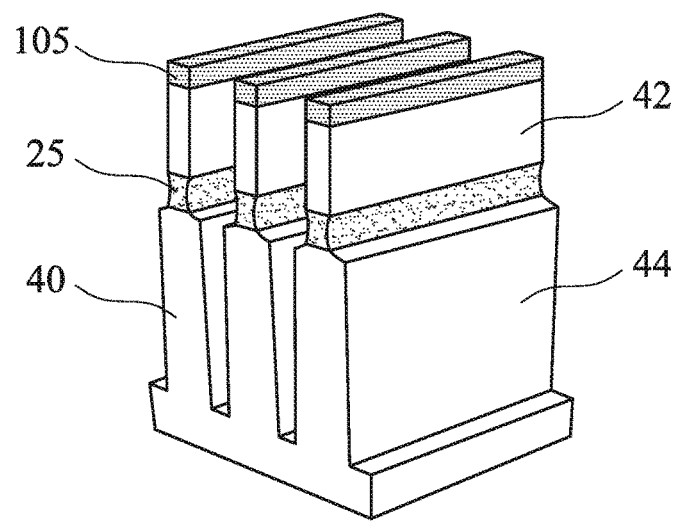

As shown in FIG. 5, part of the SiGe oxide layer 25 is removed, by using, for example, wet etching. The etchant of the wet etching may be dilute HF. By adjusting the etching conditions (e.g., etching time), the silicon oxide formed on the side walls of the Si first epitaxial layer 30 and the Si substrate 10 is removed. The SiGe oxide layer 25 is also slightly etched.

Next, an isolation insulating layer 50 is formed. The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

Figure 6:
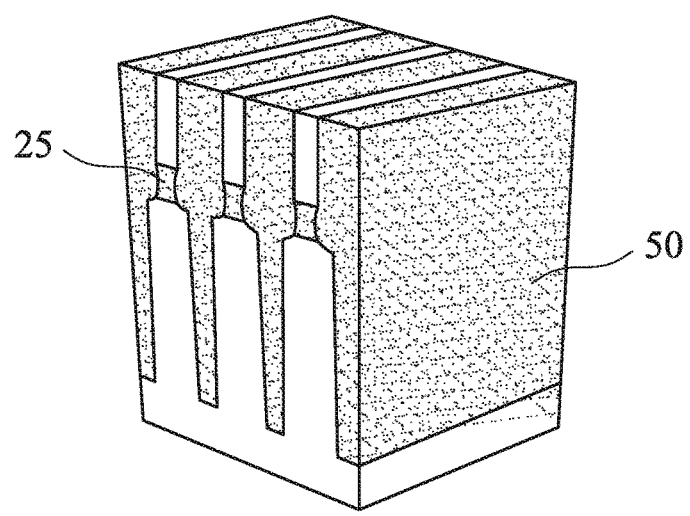

Further, the mask patterns 105 and a top portion of the isolation insulating layer 50 are removed by, for example, a chemical mechanical polishing (CMP) method or other planarization methods such as an etch-back process. The resultant structure is shown in FIG. 6.

After forming the isolation insulating layer 50, a thermal process, for example, an anneal process, may be performed to improve the quality of the isolation insulating layer 50. The thermal process may be performed before or after the planarization operations.

Figure 7:
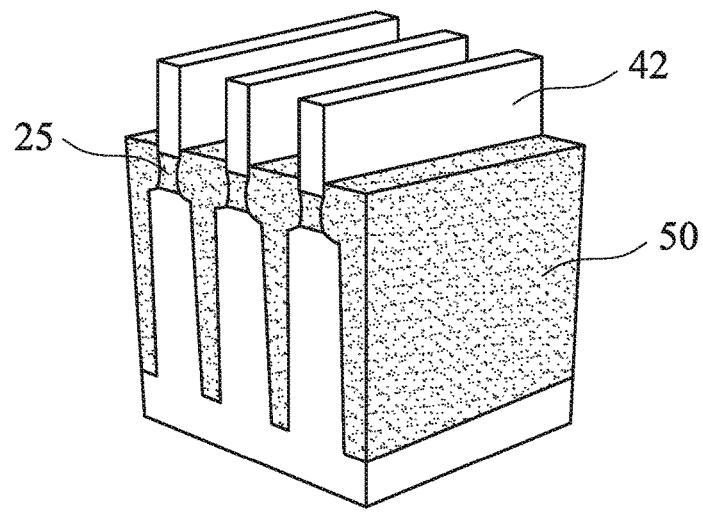

As shown in FIG. 7, the thickness of the isolation insulating layer 50 is reduced by, for example, an etch-back process so as to expose a part of the fin structures 40. The exposed part 42 of the fin structure 40 becomes a channel layer of the Fin FET and the embedded part in the isolation insulating layer becomes a well layer 44 of the Fin FET. The etch-back process may be performed by using dry etching or wet etching. By adjusting etching time, a desired thickness of the remaining isolation insulating layer 50 can be obtained.

In FIG. 7, the SiGe oxide layer 25 is not exposed from the isolation insulating layer 50, and the bottom of the channel layer 42 is embedded in the isolation insulating layer 50. However, in some embodiments, the SiGe oxide layer 25 and the entire channel layer 42 may be exposed from the isolation insulating layer 50.

Figure 8:
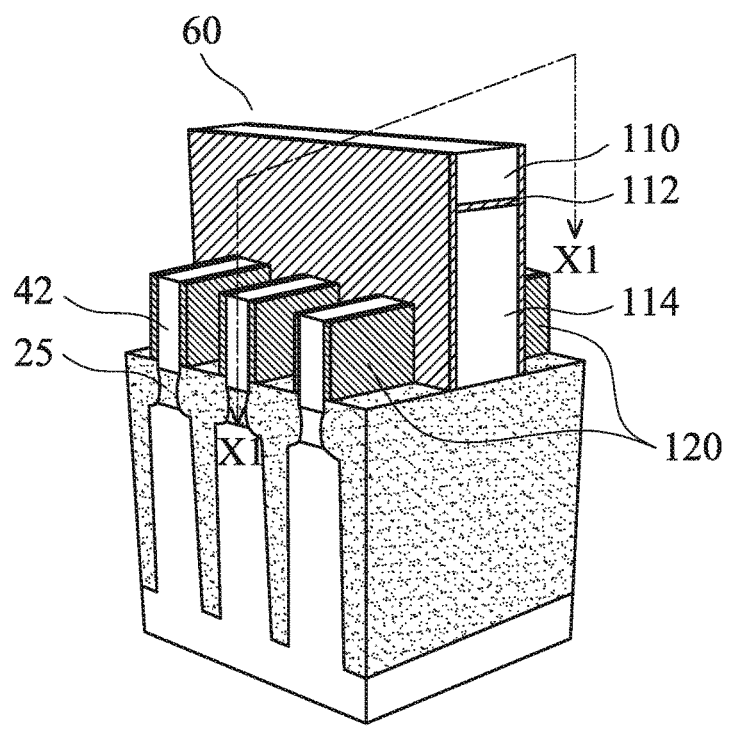

As shown in FIG. 8, a gate structure 60 is formed over part of the channel layers 42 of the fin structures 40. A gate dielectric layer 115 (see, FIG. 9) and an electrode layer are formed over the isolation insulating layer 50 and the channel layer 42, and then patterning operations are performed so as to obtain gate structure 60 including a gate electrode layer 114 and the gate dielectric layer 115. The gate electrode layer 114 is poly silicon in this embodiment. The patterning of the poly silicon layer is performed by using a hard mask including a silicon nitride layer 112 and an oxide layer 110 in some embodiments. In other embodiments, the layer 112 may be silicon oxide and the layer 110 may be silicon nitride. The gate dielectric layer may be silicon oxide formed by CVD, PVD, ALD, e-beam evaporation, or other suitable process.

In one embodiment, a gate-last technology (a gate replacement technology) is employed. In the gate-last technology, the gate electrode layer 114 and the gate dielectric layer 115 formed in the foregoing operations are a dummy electrode layer and a dummy gate dielectric layer, respectively, which are eventually removed.

In the alternative, a gate-first technology may be employed in other embodiments. In such a case, the gate electrode layer 114 and the gate dielectric layer 115 are used as a gate electrode and a gate dielectric layer of a Fin FET. In some embodiments, the gate dielectric layer 115 may include one or more layers of silicon oxide, silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer 115 is in the range of about 1 nm to 5 nm. In some embodiments, the gate dielectric layer 115 may include an interfacial layer made of silicon dioxide. In some embodiments, the gate electrode layer 114 may comprise a single layer or multilayer structure.

Further, the gate electrode layer 114 may be doped poly-silicon with uniform or non-uniform doping. In some alternative embodiments, the gate electrode layer 114 may include a metal such as Al, Cu, W, Ti, Ta, TiN, TiAl, TiAlN, TaN, NiSi, CoSi, other conductive materials with a work function compatible with the substrate material, or combinations thereof. The electrode layer for the gate electrode layer 114 may be formed using a suitable process such as ALD, CVD, PVD, plating, or combinations thereof. The width of the gate electrode layer 114 is in the range of about 30 nm to about 60 nm in some embodiments.

Further, as shown in FIG. 8, side wall insulating layers 120 made of silicon oxide, silicon nitride and/or silicon oxynitride are formed over main side walls of the gate structure 60 and main side walls of the channel layer 42 not covered by the gate structure 60. The material of the side wall insulating layers 120 is silicon nitride in this embodiment.

To form the side wall insulating layer 120, a layer of silicon nitride is formed over the entire structure by using CVD and etch-back operations are performed.

Figure 9:
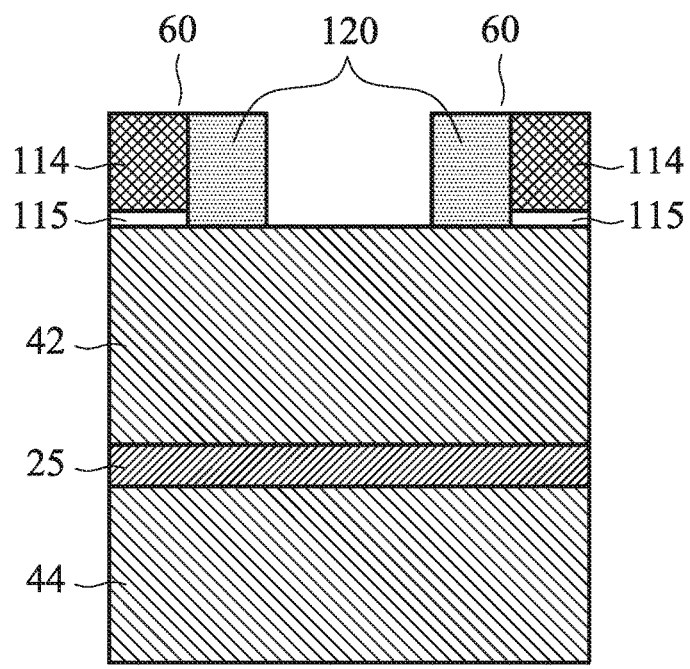

FIG. 9 shows a cross sectional view along line X1-X1 of FIG. 8 cutting one channel layer 42 under the gate structure 60. In FIGS. 9-15, upper portion of the gate structure 60 is not shown. While FIG. 8 shows one gate structure 60, in FIG. 9, two gate structures are illustrated. However, the number of the gate structure per fin structure is not limited to one or two. The numbers may be three, four or five or more.

Figure 10:
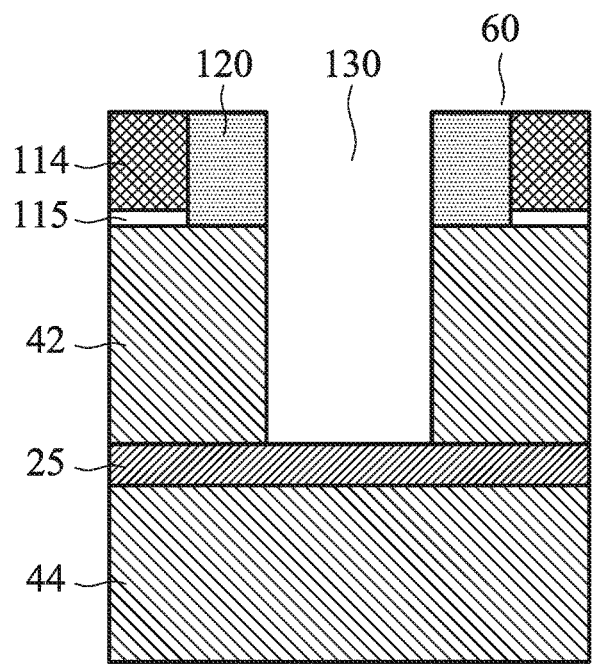

As shown in FIG. 10, portions of the channel layer 42 not covered by the gate structures 60 are etched to form recessed portion 130. The recessed portion 130 is formed until the SiGe oxide layer 25 is exposed. The recess etching of the channel layer 42 is performed by plasma etching using gases including $CH_4$, $CF_4$, $CH_2F_2$, $CHF_3$, $O_2$, HBr, $Cl_2$, $NF_3$, $N_2$ and/or He under the pressure of 3 to 20 mTorr, in some embodiments. The recess etching is anisotropic etching.

Figure 11:
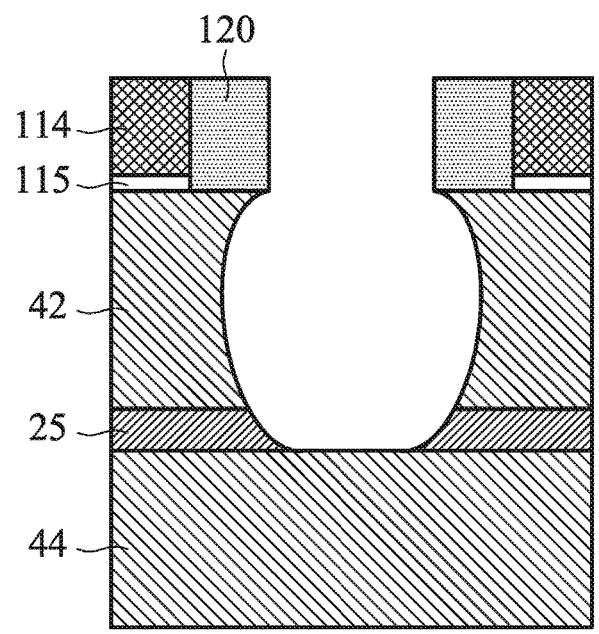

As shown in FIG. 11, part of the SiGe oxide layer 25 is etched by dry etching using, for example, $CF_4$ and/or $CH_2F_2$ gas, and/or wet etching. This etching is isotropic. During the etching of SiGe oxide layer 25, part of the Si channel layer 42 is also etched.

Figure 12:
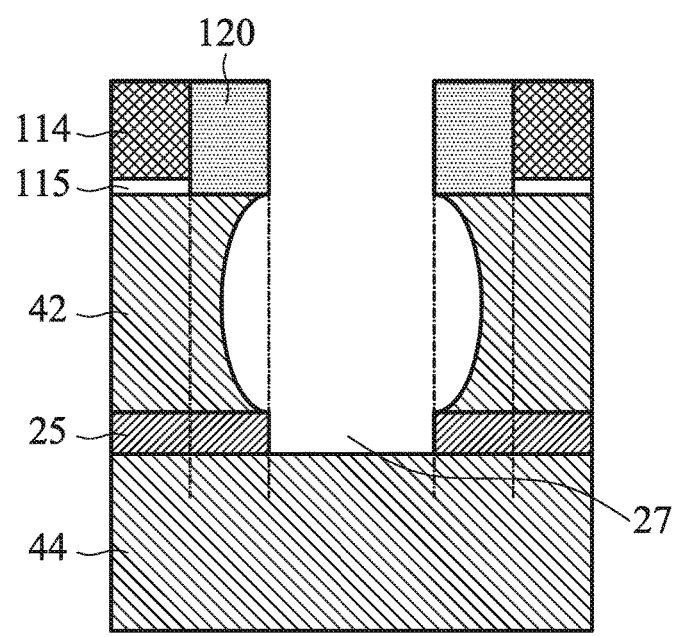

As shown in FIG. 12, an additional SiGe oxide etching is performed by using dry etching using, for example, $CF_4$ and/or $CH_2F_2$ gas, and/or wet etching, so that a surface of the well layer 44 is exposed.

Figure 13:
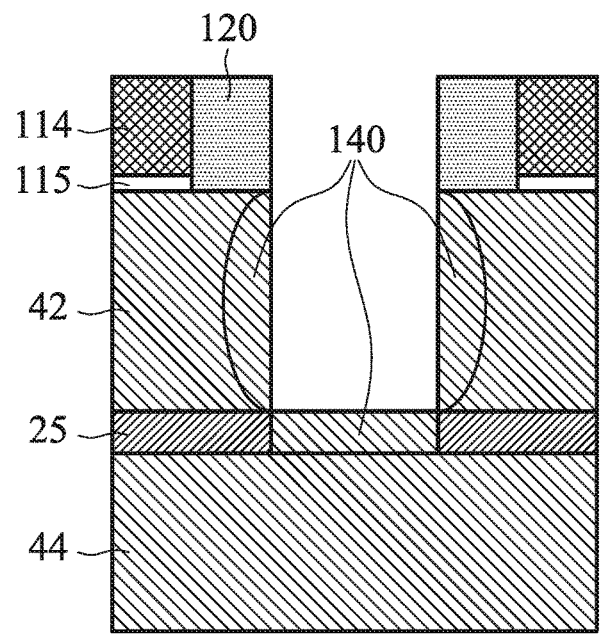

As shown in FIG. 13, epitaxial semiconductor layers 140 are formed on the channel layer 42 and the well layer 44 inside the recessed portion 130. The epitaxial semiconductor layers 140 are the same material as the channel layer 42. In this embodiment, the channel layer 42 and the epitaxial semiconductor layer 140 are made of Si. When the substrate 10 is (100) Si, the upper surface of the well layer 44 is also (100) plane and the upper surface of the epitaxial layer 140 formed over the well layer 44 is also (100) plane. The thickness of the epitaxial semiconductor layers 140 is in a range of about 3 nm to about 20 nm in some embodiment, and may be in a range of about 5 nm to about 10 nm in other embodiments.

After forming the epitaxial semiconductor layers 140, the bottom region 145 of the recessed portion 130 is modified such that etching selectivity (resistivity) of the modified bottom region 145 against an alkaline solution such as TMAH (tetramethylammonium hydroxide) or KOH with respect non-modified Si layer is increased. In some embodiment, the modified bottom region 145 is not substantially etched by the alkaline solution. For example, when the Si layer is heavily doped with a p-type dopant, an etching rate of the $P^{++}Si$ layer by the alkaline solution decreases.

Figure 14:
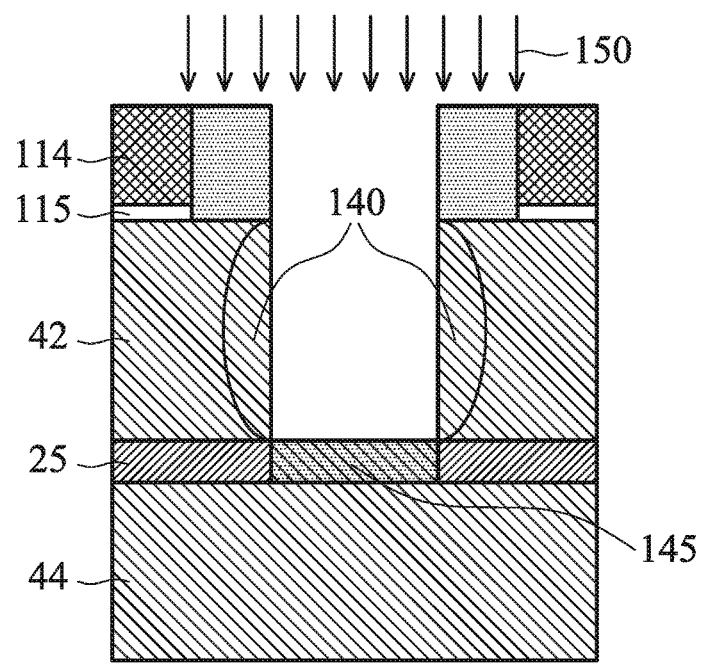

As shown in FIG. 14, a p-type impurity 150 is ion-implanted to the Si epitaxial layer in the bottom of the recessed portion. In some embodiments, the p-type impurity is boron or $BF_2$. By implanting boron, the bottom of the recessed portion becomes a modified bottom region 145.

The dose amount of boron implantation is in a range of about $1 \times 10^{15}$ ion/$cm^2$ to about $1 \times 10^{16}$ ion/$cm^2$ in some embodiments, and may be in a range of about $2 \times 10^{15}$ ion/$cm^2$ to about $5 \times 10^{16}$ ion/$cm^2$ in other embodiments. It is noted that the dose amount of about $1 \times 10^{15}$ ion/$cm^2$ to about $1 \times 10^{16}$ ion/$cm^2$ corresponds to about $0.5 \times 10^{20}$ atom/$cm^3$ to about $0.5 \times 10^{21}$ atom/$cm^3$ in the implanted layer. The acceleration energy is in a range of about 100 keV to about 200 keV in some embodiments, and may be in a range of about 120 keV to about 150 keV. After the ion implantation, annealing at a temperature of about 1000° C. to about 1200° C. is performed to drive in the impurities and to re-crystalize the implanted Si region. By heavily implanting boron into the (100) Si layer, the etching resistivity against TMAH becomes a few to several times of the etching resistivity of the well layer 44 and/or the channel layer 42 (non-modified Si layers) against TMAH. The depth of the modified bottom region 145 is in a range of about 3 nm to about 20 nm in some embodiment, and may be in a range of about 5 nm to about 10 nm in other embodiments.

Figure 15:
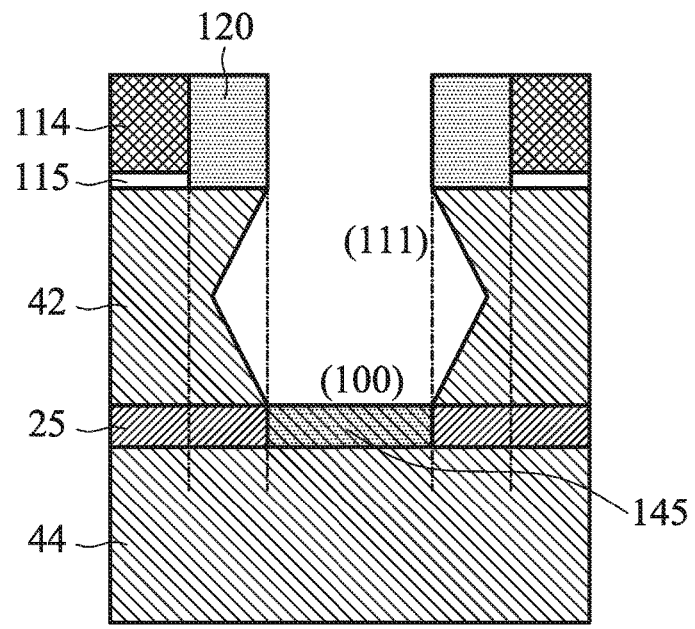

As shown in FIG. 15, the Si epitaxial layer 140 and the channel layer 42 are subjected to wet etching by alkaline solution, for example, TMAH. Since the bottom region 145 is implanted with boron, the bottom region 145 is not etched as much as the side regions of the Si epitaxial layer 140. By TMAH wet etching, the side regions of the Si epitaxial layer 140 and the channel layer 42 are laterally etched, and surfaces corresponding to (111) plane appear.

If the bottom region is not modified, the etching by TMAH proceeds to the vertical direction, and part of the well layer 44 is also etched. In contrast, when the bottom region is modified, it is possible to prevent unnecessary vertical etching to the well layer 44, while precisely controlling lateral etching of the Si epitaxial layer 140 and the channel layer 42. For example, an end of the laterally etched surface of the channel layer 42 can be located under the side wall insulating layer 120 in some embodiments, and may be located under the gate electrode layer 114.

In certain embodiments, the channel layer 42 may be made of Ge or $Si_{(1-x)}Ge_x$, where x is in a range of about 0.1 to about 0.9. In such a case, the epitaxial layer 140 includes Ge or $Si_{(1-x)}Ge_x$.

Figure 16:
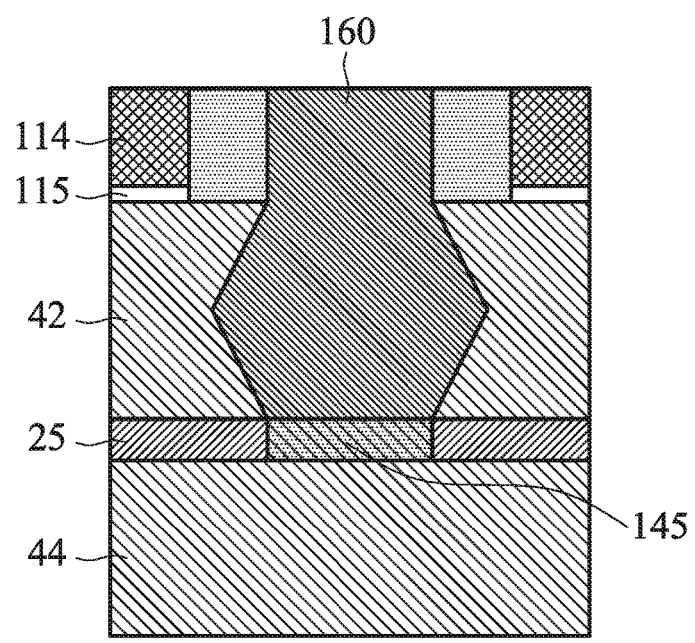
Figure 17:
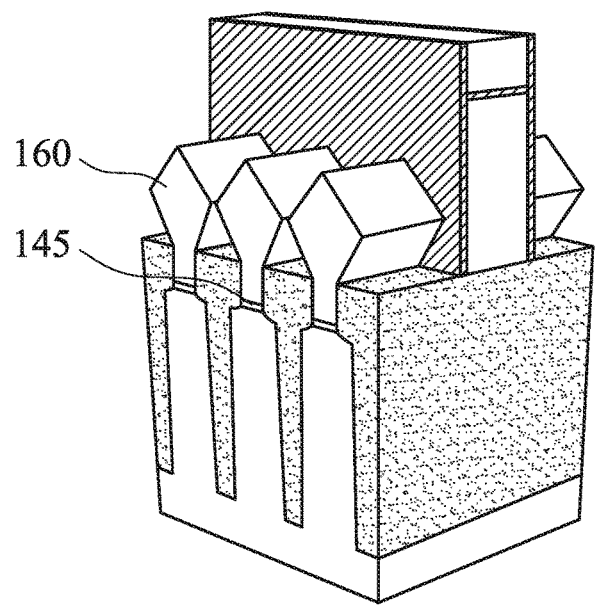

After the desirable amount of the Si epitaxial layer 140 and the channel layer 42 is etched, a strain layer 160 is formed in the recessed portion, as shown in FIGS. 16 and 17. In some embodiments, the strain layer 160 includes a single layer or multiple layers including SiGe for a p-type FET and SiP, SiC or SiCP for an n-type FET. The strain material is epitaxially formed in the recessed portion. The strain layer 160 becomes part of a source and a drain. FIG. 16 shows an exemplary perspective view of the semiconductor FET device after the strain layer 160 is formed.

Figure 18:
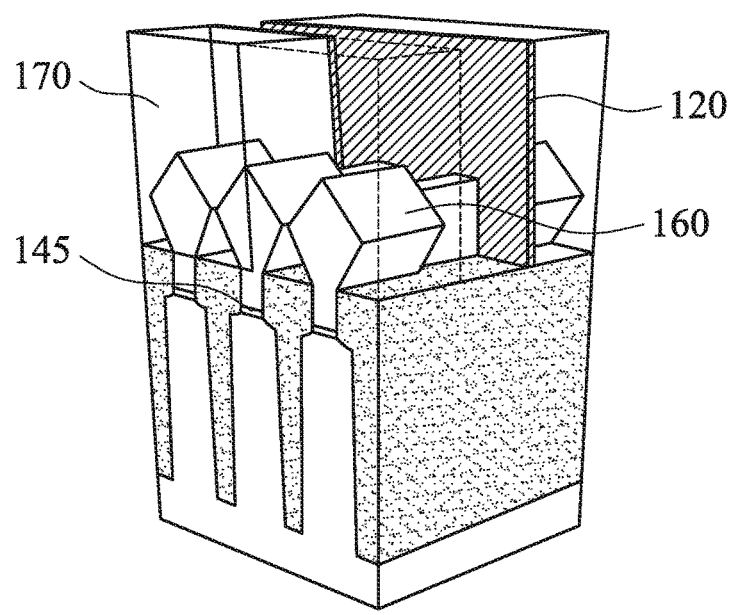

After forming the strain layer 160 (source/drain), an interlayer dielectric layer 170 is formed over the structure of FIGS. 16 and 17. The poly silicon gate electrode layer 114 is removed thereby forming a gate electrode space, as shown in FIG. 18. The insulating material for the interlayer dielectric layer 170 may include one or more layers of silicon oxide, silicon nitride, silicon oxynitride (SiON), SiOCN, fluoride-doped silicate glass (FSG), or a low-K dielectric material, formed by CVD.

Figure 19:
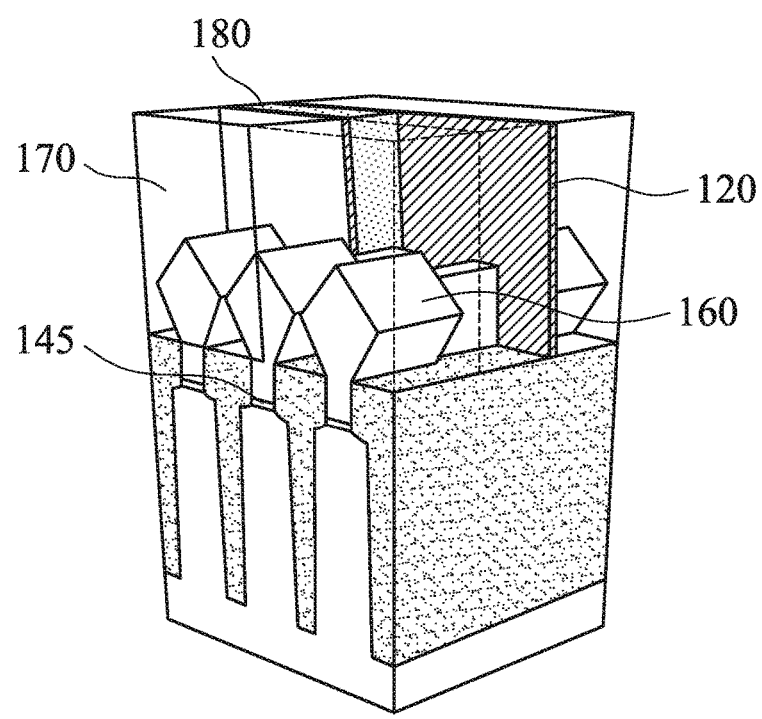

As shown in FIG. 19, a metal gate structure 180 is formed in the gate electrode space. The metal gate structure 180 includes a metal gate electrode layer and a gate dielectric layer. The metal gate electrode layer may include a single layer or multilayer structure. In the present embodiment, the metal gate electrode layer includes a metal such as Al, Cu, W, Ti, Ta, TiN, TiAl, TiAlN, TaN, NiSi, CoSi, other conductive materials with a work function compatible with the substrate material, or combinations thereof. The metal gate electrode layer may be formed using a suitable process such as ALD, CVD, PVD, plating, or combinations thereof. The width of the metal gate electrode layer is in the range of about 30 nm to about 60 nm in some embodiments. In some embodiments, the gate dielectric layer may include silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer is in the range of about 1 nm to 5 nm.

It is understood that the Fin FET device may undergo further CMOS processes to form various features such as contacts/vias, interconnect metal layers, dielectric layers, passivation layers, etc.

The various embodiments or examples described herein offer several advantages over the existing art. In some embodiments of the present disclosure, the bottom Si epitaxial region of the recessed portion is modified by implanting impurities such as boron. With the modified bottom region, it is possible to prevent unnecessary vertical etching to the well layer, while precisely controlling lateral etching of the Si epitaxial layer and the channel layer in the recessed portion.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a fin structure including a well layer, an oxide layer disposed over the well layer and a channel layer disposed over the oxide layer, is formed. An isolation insulating layer is formed so that the channel layer of the fin structure protrudes from the isolation insulating layer and at least a part of the oxide layer or an entirety of the oxide layer is embedded in the isolation insulating layer. A gate structure is formed over a part of the fin structure and over the isolation insulating layer. A recessed portion is formed by etching a part of the fin structure not covered by the gate structure such that the oxide layer is removed and a surface of the well layer is exposed. An epitaxial layer is formed over the exposed well layer and over the channel layer in the recessed portion. The epitaxial layer formed over the exposed well layer is modified into a modified layer such that etching selectivity of the modified layer against an alkaline solution is increased.

In accordance with another aspect of the present disclosure, in a method for manufacturing a semiconductor device, a fin structure is formed over a substrate. The fin structure includes a well layer, an oxide layer disposed over the well layer and a channel layer disposed over the oxide layer. An isolation insulating layer is formed so that the channel layer of the fin structure protrudes from the isolation insulating layer and at least a part of the oxide layer or an entirety of the oxide layer is embedded in the isolation insulating layer. A first gate structure and a second gate structure are formed over a part of the fin structure and over the isolation insulating layer. A recessed portion is formed by etching a part of the fin structure between the first gate structure and the second gate structure such that the oxide layer is removed and a surface of the well layer is exposed between the first gate structure and the second gate structure. An epitaxial layer is formed over the exposed well layer and over the channel layer in the recessed portion. The epitaxial layer formed over the exposed well layer is modified into a modified layer such that etching selectivity of the modified layer against an alkaline solution is increased.

In accordance with another aspect of the present disclosure, a semiconductor device includes a Fin FET device. The Fin FET device includes a fin structure extending in a first direction and protruding from an isolation insulating layer. The fin structure and the isolation insulating layer are disposed over a substrate. The fin structure includes a well layer, an oxide layer disposed over the well layer and a channel layer disposed over the oxide layer. The Fin FET device also includes a gate stack. The gate stack includes a gate electrode layer and a gate dielectric layer, covers a portion of the fin structure, and extends in a second direction perpendicular to the first direction. The FET device further includes a source and a drain, each including a stressor layer disposed in and over recessed portions formed in the fin structure. The stressor layer applies a stress to a channel layer of the fin structure under the gate stack. Further, the FET device includes a modified layer disposed between the well layer and the stressor layer. Etching resistivity of the modified layer against an alkaline solution is higher than at least one of the well layer and the channel layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a fin structure including a well layer, an oxide layer disposed over the well layer and a channel layer disposed over the oxide layer;

forming an isolation insulating layer so that the channel layer of the fin structure protrudes from the isolation insulating layer and at least a part of the oxide layer or an entirety of the oxide layer is embedded in the isolation insulating layer;

forming a gate structure over a part of the fin structure and over the isolation insulating layer;

forming a recessed portion by etching a part of the fin structure not covered by the gate structure such that the oxide layer is removed and a surface of the well layer is exposed;

forming an epitaxial layer over the exposed well layer and over the channel layer in the recessed portion; and modifying the epitaxial layer formed over the exposed well layer, thereby forming a modified layer such that etching selectivity of the modified layer against an alkaline solution with respect to a non-modified epitaxial layer is increased, wherein:

modifying the epitaxial layer is performed by implanting a p-type impurity, the p-type impurity is boron, and a dose amount of boron is in a range of $1\times10^{15}$ ion/cm$^2$ to $1\times10^{16}$ ion/cm$^2$.

2. The method of claim 1, wherein the oxide layer includes SiGe oxide.

3. The method of claim 1, wherein the well layer and the channel layer are made of silicon or a silicon compound.

4. The method of claim 1, wherein the alkaline solution is tetramethylammonium hydroxide or KOH.

5. The method of claim 4, wherein the etching the epitaxial layer is performed with tetramethylammonium hydroxide or KOH.

6. The method of claim 1, further comprising:
etching the epitaxial layer over the channel layer and the channel layer; and
forming a strain layer over the modified layer and the etched channel layer.

7. The method of claim 2, wherein the SiGe oxide is formed by thermally oxidizing a SiGe layer formed on the well layer.

8. The method of claim 1, wherein the epitaxial layer is formed such that the epitaxial layer does not fully fill the recessed portion.

9. The method of claim 8, further comprising, after the modified layer is formed, forming a semiconductor layer over the modified layer so as to fully fill the recessed portion.

10. A method for manufacturing a semiconductor device, comprising:

forming a fin structure over a substrate, the fin structure including a well layer, an oxide layer disposed over the well layer and a channel layer disposed over the oxide layer;

forming an isolation insulating layer so that the channel layer of the fin structure protrudes from the isolation insulating layer and at least a part of the oxide layer or an entirety of the oxide layer is embedded in the isolation insulating layer;

forming a first gate structure and a second gate structure over a part of the fin structure and over the isolation insulating layer;

forming a recessed portion by etching a part of the fin structure between the first gate structure and the second gate structure such that the oxide layer is removed and a surface of the well layer is exposed between the first gate structure and the second gate structure;

forming an epitaxial layer over the exposed well layer and over the channel layer in the recessed portion; and modifying the epitaxial layer formed over the exposed well layer, thereby forming a modified layer such that etching selectivity of the modified layer against an alkaline solution with respect to a non-modified epitaxial layer is increased, wherein:

the modifying the epitaxial layer is performed by implanting boron, and a dose amount of boron is in a range of $1\times10^{15}$ ion/cm$^2$ to $1\times10^{16}$ ion/cm$^2$.

11. The method of claim 10, wherein:
the oxide layer includes SiGe oxide, and
the well layer and the channel layer are made of silicon or a silicon compound.

12. The method of claim 10, wherein the fin structure is formed over (100) plane of the substrate.

13. The method of claim 10, wherein:
the alkaline solution is tetramethylammonium hydroxide (TMAH) or KOH, and
the etching the epitaxial layer is performed with TMAH or KOH.

14. The method of claim 10, further comprising:
etching the epitaxial layer over the channel layer and the channel layer; and
forming a strain layer over the modified layer and the etched channel layer.

15. The method of claim 10, wherein the epitaxial layer is formed such that the epitaxial layer does not fully fill the recessed portion.

16. The method of claim 15, further comprising, after the modified layer is formed, forming a semiconductor layer over the modified layer so as to fully fill the recess.

17. A semiconductor device, comprising:
a Fin FET device including:
a fin structure extending in a first direction and protruding from an isolation insulating layer, the fin structure and the isolation insulating layer being disposed over a substrate, the fin structure including a well layer, an oxide layer disposed over the well layer and a channel layer disposed over the oxide layer;

a gate stack including a gate electrode layer and a gate dielectric layer, covering a portion of the fin structure and extending in a second direction perpendicular to the first direction;

a source and a drain, each including a stressor layer disposed in and over recessed portions formed in the fin structure, the stressor layer applying a stress to a channel layer of the fin structure under the gate stack; and a modified layer disposed between the well layer and the stressor layer and in contact with the well layer, wherein etching resistivity of the modified layer against an alkaline solution is higher than at least one of the well layer and the channel layer, a thickness of the modified layer is smaller than a depth of the recessed portions, and the modified layer is silicon doped with boron in an amount of $0.5\times10^{20}$ atom/cm$^3$ to about $0.5\times10^{21}$ atom/cm$^3$.

18. The semiconductor device of claim 17, wherein the alkaline solution is tetramethylammonium hydroxide or KOH.

19. The semiconductor device of claim 17, wherein the fin structure is disposed over (100) plane of the substrate.

20. The semiconductor device of claim 17, wherein a height of the modified layer measured from the substrate is smaller than a height of the isolation insulating layer measured form the substrate.

* * * * *